United States Patent
Fujii

(10) Patent No.: US 10,877,181 B2
(45) Date of Patent: Dec. 29, 2020

(54) SUBSTRATE WITH LOW-REFLECTION PROPERTY AND MANUFACTURING METHOD THEREOF

(71) Applicant: AGC Inc., Tokyo (JP)

(72) Inventor: Kensuke Fujii, Chiyoda-ku (JP)

(73) Assignee: AGC Inc., Tokyo (JP)

( * ) Notice: Subject to any disclaimer, the term of this patent is extended or adjusted under 35 U.S.C. 154(b) by 184 days.

(21) Appl. No.: 15/800,253

(22) Filed: Nov. 1, 2017

(65) Prior Publication Data

US 2018/0136367 A1   May 17, 2018

(30) Foreign Application Priority Data

Nov. 11, 2016  (JP) .................................. 2016-220153
Sep. 6, 2017  (JP) .................................. 2017-171278

(51) Int. Cl.
  *G02B 1/11*  (2015.01)
  *C23C 14/34* (2006.01)
  *G02B 1/115* (2015.01)
  *G02B 5/00*  (2006.01)

(52) U.S. Cl.
  CPC ................ *G02B 1/11* (2013.01); *C23C 14/34* (2013.01); *G02B 1/115* (2013.01); *G02B 5/003* (2013.01)

(58) Field of Classification Search
  None
  See application file for complete search history.

(56) References Cited

U.S. PATENT DOCUMENTS

| | | | | |
|---|---|---|---|---|
| 9,025,248 B2 * | 5/2015 | Fujii | .................. | G02B 1/11 359/580 |
| 2007/0053063 A1 * | 3/2007 | Adachi | .................. | G02B 1/111 359/582 |
| 2010/0171908 A1 * | 7/2010 | Yoshihara | .............. | G02B 1/111 349/96 |
| 2011/0033679 A1 * | 2/2011 | Fukawa | .............. | C03C 17/3441 428/212 |
| 2011/0228214 A1 * | 9/2011 | von Blanckenhagen | .................. | G02B 1/115 351/159.24 |

(Continued)

FOREIGN PATENT DOCUMENTS

| | | |
|---|---|---|
| JP | 2005-242265 | 9/2005 |
| JP | 2014-224979 A | 12/2014 |
| TW | 201442971 A | * 11/2014 |

*Primary Examiner* — Derek S. Chapel
(74) *Attorney, Agent, or Firm* — Oblon, McClelland, Maier & Neustadt, L.L.P.

(57) ABSTRACT

Provided is a substrate with low-reflection property having small changes in reflected light and color between a principal surface and a side surface when it is visually recognized, and including high displayability in a front substrate or the like which is disposed while exposing the side surface. A substrate 10 with low-reflection property includes: a transparent substrate 11; a first low-reflection film 12 provided on one principal surface of the transparent substrate 11; and a second low-reflection film 13 provided on a side surface of the transparent substrate 11, wherein luminous reflectance Rtot of the first low-reflection film 12 provided on one principal surface is 1.5% or less, luminous reflectance Rs of the second low-reflection film 13 provided on the side surface is 2.5% or less, chromaticity a* is 0 to 4, and chromaticity b* is 3 to 9.

11 Claims, 3 Drawing Sheets

(56) References Cited

U.S. PATENT DOCUMENTS

| | | | | |
|---|---|---|---|---|
| 2013/0271836 A1* | 10/2013 | Fukaya | .................... | G02B 1/11 |
| | | | | 359/507 |
| 2015/0338552 A1* | 11/2015 | Fujii | ...................... | G02B 1/105 |
| | | | | 359/601 |
| 2017/0197875 A1* | 7/2017 | Fujii | ........................ | C03C 17/42 |
| 2018/0038995 A1* | 2/2018 | Fujii | ........................ | B32B 7/02 |
| 2020/0018872 A1* | 1/2020 | Fujii | ........................ | G02B 1/18 |

\* cited by examiner

SUBSTRATE WITH LOW-REFLECTION PROPERTY AND MANUFACTURING METHOD THEREOF

CROSS REFERENCE TO RELATED APPLICATIONS

This application is based upon and claims the benefit of priority from Japanese Patent Applications No. 2016-220153 filed on Nov. 11, 2016, and No. 2017-171278 filed on Sep. 6, 2017; the entire contents of which are incorporated herein by reference.

FIELD

The present invention relates to a substrate with low-reflection property having a low-reflection film at each of a principal surface and a side surface of a transparent substrate, and a manufacturing method of the substrate with the low-reflection property.

BACKGROUND

In recent years, in display devices such as a tablet type PC (Personal Computer), a smartphone, a car navigation system, and a touch panel, there is provided a front substrate such as a cover glass on a visible side of a display panel, for the purpose of protecting the display panel. In general, there is provided a low-reflection film on a principal surface on a visible side of the front substrate, for the purpose of increasing visibility of display by suppressing reflected glare caused by the reflection of light. In the front substrate with the low-reflection property as above, a light shielding part such as a black printed layer is provided at a peripheral part of a principal surface on a non-visible side on which the low-reflection film is not provided, for the purpose of improving design and a beautiful appearance (refer to JP-A 2005-242265(KOKAI), for example).

There are a lot of products where the side surface of the front substrate is exposed from a viewpoint of design in the front substrate for the display as stated above.

When a substrate is manufactured by forming a low-reflection film on a principal surface of a front substrate and then cutting into a desired size regarding the front substrate exposing not only the principal surface on a visible side but also a side surface as above, processes for the low-reflection film are not performed on the side surface, and there are problems such that a difference in chromaticity from the principal surface and sparkle due to presence/absence of light reflection or the like become remarkable. Even when the formation process of the low-reflection film is performed on the side surface, there is not known an art to match colors between the principal surface and the side surface. Accordingly, when people see the front substrate, large changes in reflected light, color, and so on are felt when it is visually recognized.

SUMMARY

The present invention is created while dealing with the above-described problems, and an object thereof is to provide a substrate with low-reflection property in which changes in reflected light and color between a principal surface and a side surface are small when it is visually recognized, including high displayability, and capable of keeping a beautiful appearance even in a front substrate or the like disposed while exposing the side surface.

A substrate with low-reflection property of this invention is characterized in that it includes: a transparent substrate; a first low-reflection film provided on one principal surface of the transparent substrate; and a second low-reflection film provided on a side surface of the transparent substrate, in which luminous reflectance Rtot of the first low-reflection film provided on the one principal surface is 1.5% or less, luminous reflectance Rs of the second low-reflection film provided on the side surface is 2.5% or less, chromaticity a* of the second low-reflection film provided on the side surface is 0 to 4, and chromaticity b* of the second low-reflection film provided on the side surface is 3 to 9.

A display device of this invention is characterized in that it includes: a display; and the substrate with the low-reflection property according to this invention provided on a front face of the display as a front substrate.

A manufacturing method of a substrate with low-reflection property of this invention is characterized in that it includes: fixing a transparent substrate on a carrier substrate for fixing the transparent substrate with a spacer therebetween to have a predetermined interval; and simultaneously film-forming a first low-reflection film on one principal surface of the transparent substrate and a second low-reflection film on a side surface of the transparent substrate by sputtering, in which luminous reflectance Rtot of the first low-reflection film provided on the one principal surface is 1.5% or less, luminous reflectance Rs of the second low-reflection film provided on the side surface is 2.5% or less, chromaticity a* of the second low-reflection film provided on the side surface is 0 to 4, and chromaticity b* of the second low-reflection film provided on the side surface is 3 to 9.

A substrate with low-reflection property of this invention includes a low-reflection film on each of a principal surface and a side surface of the transparent substrate in which luminous reflectance with respect to incident light from a low-reflection film side is adjusted, and therefore, it is visually recognized to have small changes in light reflection, color, and so on between the principal surface and the side surface, and it is excellent in displayability and a beautiful appearance. The substrate with the low-reflection property as stated above is used as a front substrate, and thereby, it is possible to improve display visibility of a display device, and to supply excellent design and a beautiful appearance.

DETAILED DESCRIPTION

Hereinafter, modes for carrying out the present invention will be described. The present invention is not limited to the following embodiments, and the following embodiments may be modified and replaced in various ways without departing from the scope of the present invention.

Figure 1:
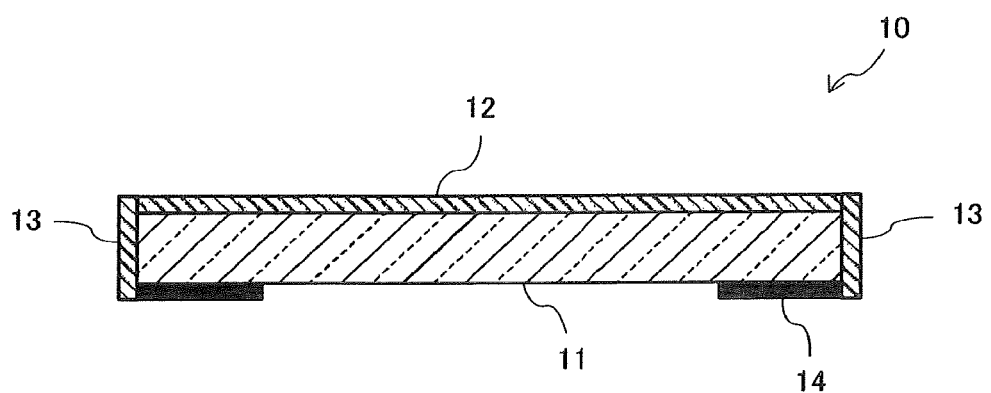
FIG. 1 is a sectional view schematically illustrating one embodiment of a substrate with low-reflection property of the present invention.

FIG. 1 is a sectional view schematically illustrating one embodiment of a substrate with low-reflection property of the present invention.

A substrate 10 with low-reflection property of an embodiment illustrated here includes a transparent substrate 11, a first low-reflection film 12 formed on one principal surface of the transparent substrate 11, a second low-reflection film 13 formed on a side surface of the transparent substrate 11, and a black printed sahde 14 formed on a part of the other principal surface of the transparent substrate 11.

In the substrate 10 with the low-reflection property of the embodiment, luminous reflectance Rtot measured with respect to incident light from the first low-reflection film 12 side is 1.5% or less, luminous reflectance Rs measured with respect to incident light from the second low-reflection film 13 side is 2.5% or less, chromaticity a* is 0 to 4, and chromaticity b* is 3 to 9.

The luminous reflectance is a stimulus value Y of reflection defined by JIS Z8701. In this invention, regarding Rtot of the principal surface, a spectrophotometric colorimeter (manufactured by KONICA MINOLTA, INC., model: CM-2600d) is used, and reflected light is measured by an SCI (Specular Component Include) mode in which regular reflected light and diffused reflected light are collectively measured under a light source of D65, and regarding Rs of the side surface, a micro spectrophotometer (manufactured by Olympus Corporation, USPM RUIII) is used, and reflected light is measured. The reflectance measured as described above is used to calculate the luminous reflectance.

The first luminous reflectance Rtot is found by measurement at a position near the side surface for some extent. For example, it is preferably found by measurement in a range within 50 mm from an edge line being a boundary between the side surface and the principal surface, and more preferably found by measurement in a range of 5 to 30 mm. The measurement range is set as above, and thereby, it is possible to finely correlatively express the luminous reflectance Rtot and the luminous reflectance Rs which are respectively obtained on the principal surface and the side surface, and a color change or the like which is felt when it is actually visually recognized.

The chromaticity values a* and b* are each chromaticity in a L*a*b* color system, and in this description, the L*a*b* color system is CIE 1976 (L*a*b*) color space (CIELAB) standardized by the International Commission on Illumination (CIE), representing lightness (L*) in an F2 light source, and chromaticity (a*, b*) of reflected light in the F2 light source. The chromaticity may be founded by measuring the color tint in reflected light, and a reflection spectrum may be measured. The reflection spectrum can be obtained using a spectrophotometer or a microspectrometer and thereby chromacity can be calculated.

The luminous reflectance Rtot in the first low-reflection film, the luminous reflectance Rs in the second low-reflection film, and the chromaticity a*, b* are set to satisfy the above-described relationship, and thereby, it is visually recognized such that a difference in colors or the like between the principal surface and the side surface is small, and a sense of incompatibility is small.

In this embodiment, the luminous reflectance Rtot is preferably 1.5% or less, more preferably 1.2% or less, and still more preferably 1% or less.

As the color of the first reflection film 12 provided on one principal surface of the transparent substrate 11 regarding the black printed shade 14, it is preferable that the chromaticity a* is more than −6 and less than 6 and the chromaticity b* is more than −6 and less than 6, it is more preferable that the chromaticity a* is more than −5 and less than 3 and the chromaticity b* is more than −6 and less than 3, and it is still more preferable that the chromaticity a* is more than −4 and less than 2 and the chromaticity b* is more than −4 and less than 2. It is thereby possible to suppress coloring of the reflected light to a minimum level, and it becomes easy to match with a color of the side surface.

Similarly, the luminous reflectance Rs is preferably 2.5% or less, more preferably 2% or less, and still more preferably 1.8% or less.

(Measurement of Luminous Reflectance of Principal Surface)

Figure 2:
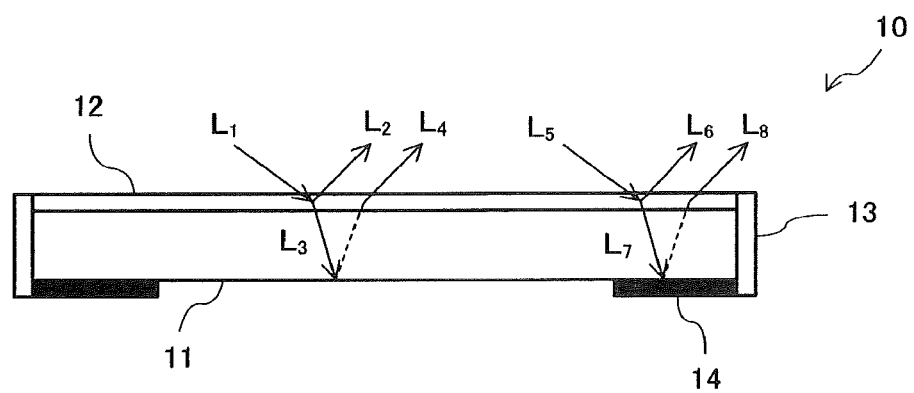
FIG. 2 is a view schematically illustrating routes of light which is incident from a low-reflection film side, in the substrate with the low-reflection property of the present invention.

Hereinafter, a calculation method of the luminous reflectance Rtot of the principal surface is described based on FIG. 2. FIG. 2 is a view schematically illustrating routes of incident light (optical paths) from the first low-reflection film 12 side to the substrate 10 with the low-reflection property of this invention. In FIG. 2, components which are the same as those in FIG. 1 are denoted by the same reference numerals.

In a region of the substrate 10 with the low-reflection property having no black printed shade 14, a part of incident light L1 which is incident on the first low-reflection film 12 from one principal surface side is reflected by a low-reflection film surface to be reflected light L2, and the rest of the incident light L1 becomes transmitted light L3 which transmits through the first low-reflection film 12 and the transparent substrate 11 in this order. A part of the transmitted light L3 is reflected by the other principal surface of the transparent substrate 11 and the reflected light transmits through the transparent substrate 11 and the first low-reflection film 12 in this order, and is emitted to the outside as emitted light L4. The routes of the light are set to a first route.

Luminous reflectance RG of the light of the first route corresponds to a sum of luminous reflectance regarding the reflected light L2, namely, luminous reflectance R1 of the first low-reflection film 12 and luminous reflectance R4 regarding the emitted light IA.

The luminous reflectance R4 is represented by Expression (I) using each reflectance along the route of the light, and the luminous reflectance RG of the light of the first route is represented by Expression (II), respectively. Note that R0 is one-side luminous reflectance obtained from the other principal surface of the transparent substrate 11.

$$R4=(1-R1)\times R0\times(1-R1) \quad (I)$$

$$RG=R1+(1-R1)\times R0\times(1-R1) \quad (II)$$

Meanwhile, in a region of the substrate 10 with the low-reflection property provided with the black printed shade 14, a part of incident light L5 which is incident on the first low-reflection film 12 from one principal surface side is reflected to be reflected light L6, and the rest of the incident light L5 becomes transmitted light L7 which transmits through the first low-reflection film 12 and the transparent substrate 11 in this order. A part of the transmitted light L7 is reflected at an interface between the other principal surface of the transparent substrate 11 and the black printed shade 14, and the reflected light transmits through the transparent substrate 11 and the first low-reflection film 12 in this order, and then is emitted to the outside as emitted light L8. The routes of the light are set to a second route.

The luminous reflectance Rtot of the second route corresponds to a sum of luminous reflectance regarding the reflected light L6, namely, the luminous reflectance R1 of the first low-reflection film 12 and luminous reflectance R8 regarding the emitted light L8.

The luminous reflectance R8 is represented by Expression (III) using each reflectance along the route of the light, and the luminous reflectance Rtot of the second route is represented by Expression (IV), respectively. Note that R2 is luminous reflectance of the black printed shade 14 at an interface with the transparent substrate 11.

$$R8=(1-R1)\times R2\times(1-R1) \quad \text{(III)}$$

$$Rtot=R1+(1-R1)\times R2\times(1-R1) \quad \text{(IV)}$$

In the substrate 10 with the low-reflection property, the luminous reflectance RG in the region having no black printed shade 14 and the luminous reflectance Rtot in the region provided with the black printed shade 14 are measurable amounts. Accordingly, with the given reflectance R0 of the transparent substrate set as a premise, it is possible to calculate R1 by using the aforementioned Expression (II) and R2 by using the aforementioned Expression (IV). Note that as described above, Rtot corresponds to luminous reflectance R measured with respect to the incident light from the first low-reflection film 12 side in the region having the black printed shade 14, and is 2% or less in the substrate 10 with the low-reflection property of this embodiment. Regarding R0, the reflectance can be calculated by finding, with an ellipsometer, for example, a refractive index of a rear surface of the region having no black printed shade 14, namely, the refractive index of a side on which the low-reflection film is not provided.

When the first low-reflection film 12 has absorption of absorptance A1, it is possible to calculate R1 and R2 in a similar manner to the above by setting (1−R1) to (1−R1−A1) in each of Expressions (II) and (IV). The absorptance A1 of the first low-reflection film 12 can be calculated by comparing transmittance Tg of the region having no black printed shade 14 on the other principal surface of the transparent substrate 11 and transmittance T0 of only the transparent substrate 11.

Actually, regarding the light, out of the transmitted light L3, for example, which is reflected by the other principal surface of the transparent substrate 11 and which transmits through the transparent substrate 11 and the first low-reflection film 12 in this order, a part thereof is emitted from the inside of glass as the emitted light L4, and a part thereof follows a route such that it is reflected by an interface between the glass and the air to return to the inside of the glass, transmits through the transparent substrate 11, and a part thereof is reflected by the other principal surface of the transparent substrate 11 to be emitted from the inside of the glass. Although it is possible to consider a route in which this cycle is repeated an arbitrary number of times, a contribution from a route of L8 and later is sufficiently small in a negligible degree, as long as R1 and R2 fall within the above-described range.

The luminous reflectance R1 of the first low-reflection film 12 is arbitrarily adjustable based on a composing material of each layer forming the first low-reflection film 12, the number of stacks, a thickness of each layer, a stacking order, and the like. R1 is preferably 1% or less, more preferably 0.6% or less, and still more preferably 0.5% or less. When the substrate with the low-reflection property is bonded to a liquid crystal display or the like as a cover glass, reflection between a rear surface of the substrate and a display surface is generally sufficiently suppressed due to optical bonding. Accordingly, R1 and reflectance from a display inside mainly contribute to reflectance of the display with the cover glass substrate. R1 is in the above-stated range, and thereby, the reflection from a stack surface can be sufficiently suppressed compared to the reflection from the display inside. The luminous reflectance R2 of the black printed shade 14 at the interface with the transparent substrate 11 can be adjusted by a kind of a material (black ink or the like) forming the black printed shade 14, a film thickness, and the like. Note that R2 is normally in a range of 0.3% to 0.8%, and therefore, the adjustment is difficult to be performed by the kind of ink, the film thickness, and the like.

(Measurement of Luminous Reflectance Rs of Side Surface)

Spectral reflectance of a side surface part is obtained as the luminous reflectance of the side surface by using a micro spectrophotometer (manufactured by Olympus Corporation, USPM RUIII). When measurement is performed, a position and an angle of a substrate where reflectance becomes maximum are found in advance, and adjustment is performed to obtain correct regular reflectance. The luminous reflectance (a stimulus value Y of reflection defined by JIS Z8701) and the color (L*a*b*) are found from the spectral reflectance.

(Relationship of Luminance Reflectance Between Principal Surface and Side Surface)

In this embodiment, a ratio between the luminous reflectance Rtot and the luminous reflectance Rs (Rs/Rtot) is preferably 1 to 3, and more preferably 1 to 2. The substrate having a small difference in colors or the like between the principal surface and the side surface, which is reasonably visually recognized more naturally can be obtained by setting the ratio within the range as above. Rs is preferably larger than Rtot. This is because when Rs is smaller than Rtot, the surface color of the side surface is difficult to be visually recognized, a rear part of a bonded casing is seen through, and color matching becomes difficult.

It turns out that the color can be visually recognized naturally when b* of a reflected color of the side surface is larger than b* of a reflected color of the principal surface, and a* of the reflected color of the side surface has the same sign as a* of the reflected color of the principal surface. This is estimated to be resulting from that regular reflection is measured as the reflectance of the side surface, but when the side surface is actually visually recognized, it is seen at an extremely high angle. Namely, it turns out that a color of regular reflection is required to satisfy the above-stated relationship in order to be visually recognized naturally when it is seen at the high angle. Concretely, b* of the side surface is preferably 1.5 times or more of b* of the principal surface, and more preferably two times or more.

(Transparent Substrate)

The transparent substrate 11 is not particularly limited as long as it is made of a transparent material where supplying of the low-reflection property by the low-reflection film is generally required, and, for example, one made of glass, resin, or a combination thereof (a composite material, a stacked material, or the like) is favorably used. A form of the transparent substrate 11 is also not particularly limited, and, for example, it may be a plate form having rigidity, a film form having flexibility, or the like.

As a resin substrate used as the transparent substrate 11, there can be cited an acryl-based resin substrate such as polymethyl methacrylate, an aromatic polycarbonate-based resin substrate such as carbonate of bisphenol A, an aromatic polyester-based resin substrate such as polyethylene terephthalate, or the like.

As a polymer film (the transparent substrate 11 of film form), there can be cited, for example, a polyester-based film such as polyethylene terephthalate, a polyolefin-based film such as polypropylene, a polyvinyl chloride film, an acrylic resin-based film, a polyethersulfone film, a polyarylate film, a polycarbonate film, or the like.

As a glass substrate used as the transparent substrate 11, there can be cited a substrate made of general glass whose main component is a silicon dioxide, for example, glass such as soda-lime silicate glass, aluminosilicate glass, borosilicate glass, non-alkali glass, or quartz glass.

When a glass substrate is used as the transparent substrate 11, a composition of the glass is preferably a composition where molding and tempering by chemical tempering can be performed, and preferably contains sodium.

The composition of the glass is not particularly limited, and glasses having various compositions can be used. For example, there can be cited aluminosilicate glass having the following compositions in mol % in terms of oxides. When "0 to 15% of MgO is contained", for example, it means that MgO is not essential but may be contained up to 15%.

(i) Glass containing 50 to 80% of $SiO_2$, 2 to 25% of $Al_2O_3$, 0 to 10% of $Li_2O$, 0 to 18% of $Na_2O$, 0 to 10% of $K_2O$, 0 to 15% of MgO, 0 to 5% of CaO, and 0 to 5% of $ZrO_2$ (ii) Glass containing 50 to 74% of $SiO_2$, 1 to 10% of $Al_2O_3$, 6 to 14% of $Na_2O$, 3 to 11% of $K_2O$, 2 to 15% of MgO, 0 to 6% of CaO, and 0 to 5% of $ZrO_2$, a sum of contents of $Si_2O$ and $Al_2O_3$ is 75% or less, a sum of contents of $Na_2O$ and $K_2O$ is 12 to 25%, and a sum of contents of MgO and CaO is 7 to 15%

(iii) Glass containing 68 to 80% of $SiO_2$, 4 to 10% of $Al_2O_3$, 5 to 15% of $Na_2O$, 0 to 1% of $K_2O$, 4 to 15% of MgO, and 0 to 1% of $ZrO_2$ (iv) Glass containing 67 to 75% of $SiO_2$, 0 to 4% of $Al_2O_3$, 7 to 15% of $Na_2O$, 1 to 9% of $K_2O$, 6 to 14% of MgO, and 0 to 1.5% of $ZrO_2$, a sum of contents of $Si_2O$ and $Al_2O_3$ is 71 to 75%, a sum of contents of $Na_2O$ and $K_2O$ is 12 to 20%, and a content of CaO is less than 1% when it is contained The glass substrate is preferable as the transparent substrate 11.

A manufacturing method of the glass substrate is not particularly limited. The glass substrate can be manufactured in a manner that desired glass raw materials are put into a melting furnace, heated and melted at 1500 to 1600° C. for fining, and then supplied to a molding apparatus to mold the molten glass into a plate form, and the resultant is subjected to slow cooling. Note that a molding method of the glass substrate is not particularly limited, and, for example, there can be used a down-draw method (for example, an overflow down-draw method, a slot down method, a redraw method, or the like), a float method, a roll-out method, a pressing method, or the like.

When the glass substrate is used as the transparent substrate 11, in order to increase strength of the obtained substrate 10 with the low-reflection property, it is preferably chemically tempered glass where chemical tempering is performed on a principal surface of the glass substrate (for example, a principal surface after being subjected to antiglare treatment to be described later).

A method of the chemical tempering is not particularly limited, and the principal surface of the glass substrate is subjected to ion exchange to form a surface layer where a compressive stress remains on the glass substrate. Concretely, an alkali metal ion whose ion radius is small (for example, Li ions, Na ions) contained in the glass in the vicinity of the principal surface of the glass substrate are exchanged into the alkali metal ion whose ion radius is larger (for example, Na ions or K ions with respect to Li ions, and K ions with respect to Na ions) at a temperature equal to or lower than a glass transition point. Consequently, the compressive stress remains on the principal surface of the glass substrate, and strength of the glass substrate is improved.

The glass substrate as the transparent substrate 11 preferably satisfies the following conditions. It is possible to make the glass substrate satisfy such conditions by being subjected to the above-described chemical tempering.

Specifically, a surface compressive stress (referred to as CS, hereinafter) of the glass substrate is preferably 400 MPa or more and 1200 MPa or less, more preferably 650 MPa or more and 950 MPa or less, and still more preferably 700 MPa or more and 900 MPa or less. The CS of 400 MPa or more is sufficient as practical strength. When the CS is 1200 MPa or less, the substrate can endure its compressive stress, and there is no concern regarding natural occurrence of breakage. When the substrate 10 with the low-reflection property of this invention is used as a front substrate (cover glass) of a display device, the CS of the glass substrate is particularly preferably 700 MPa or more and 850 MPa or less.

A depth of a stress layer (referred to as DOL, hereinafter) of the glass substrate is preferably 15 to 60 μm, more preferably 15 to 50 μm, and still more preferably 20 to 40 μm. When the DOL is 15 μm or more, even a sharp tool such as a glass cutter is used, there is no concern regarding that the glass substrate is easily damaged to be broken. When the DOL is 40 μm or less, the substrate can endure its compressive stress, and there is no concern regarding natural occurrence of breakage. When the substrate 10 with the low-reflection property of this invention is used as a front substrate (cover glass) of a display device or the like, the DOL of the glass substrate is particularly preferably 25 μm or more and 35 μm or less.

A thickness of the transparent substrate 11 can be appropriately selected according to purposes. For example, in a case of the transparent substrate 11 of plate form such as a resin substrate or a glass substrate, the thickness is preferably 0.1 to 5 mm, and more preferably 0.2 to 2 mm. When the transparent substrate 11 has a film form such as a polymer film, the thickness thereof is preferably 50 to 200 μm, and more preferably 75 to 150 μm.

When a glass substrate is used as the transparent substrate 11, and the aforementioned chemical tempering is performed, the thickness of the glass substrate is normally preferably 5 mm or less, and more preferably 3 mm or less, in order to effectively perform the chemical tempering.

When the transparent substrate 11 is a glass substrate, a size thereof can be appropriately selected according to purposes. It is preferable that, when the transparent substrate 11 is used as a cover glass of a mobile device, the size thereof is 30 mm×50 mm to 300×400 mm, and the thickness thereof is 0.1 to 2.5 mm, and when the transparent substrate 11 is used as a cover glass of a display device, the size thereof is 50 mm×100 mm to 2000×1500 mm, and the thickness thereof is 0.5 to 4 mm. The transparent substrate 11 may have a bent part at a part thereof: or may have an opening part or a recessed part.

(Antiglare Treatment)

In order to supply an antiglare property to the substrate 10 with the low-reflection property, the transparent substrate 11 may be formed to have a projecting and recessed shape on its principal surface. Note that the principal surface having the projecting and recessed shape is at least one principal surface of the transparent substrate 11, and at least the principal surface on a side provided with the first low-reflection film 12 is preferably set to the surface having the projecting and recessed shape.

Figure 3:
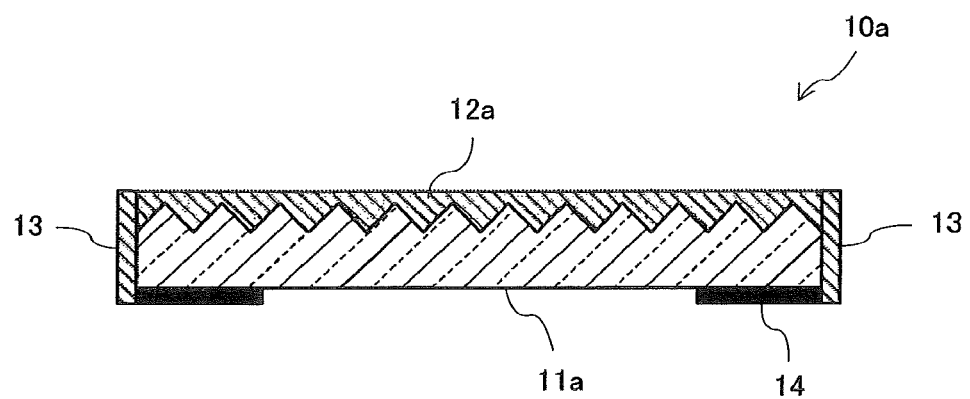
FIG. 3 is a sectional view schematically illustrating another embodiment of a substrate with low-reflection property of the present invention.

A concrete configuration of the substrate with the low-reflection property which is subjected to the antiglare treatment as stated above is exemplified in FIG. 3. A substrate 10a with low-reflection property in FIG. 3 is formed of a transparent substrate 11a where the antiglare treatment is performed on one principal surface, a first low-reflection film 12a formed on the surface subjected to the antiglare treatment, the second low-reflection film 13 formed on a side surface of the transparent substrate 11a, and the black printed shade 14. In FIG. 3, the low-reflection film 12a is formed to embed the projecting and recessed shape formed on the principal surface of the transparent substrate 11a, but it is not limited thereto, and may be formed to follow the projecting and recessed shape formed on the principal surface of the transparent substrate 11a.

As a method of forming the projecting and recessed shape, a publicly-known method such as antiglare treatment can be applied, for example. As the antiglare treatment, for example, when a glass substrate is used as the transparent substrate 11, it is possible to use a method in which surface treatment is performed chemically or physically on at least one principal surface of the glass substrate to form the projecting and recessed shape with desired surface roughness, a method in which coating treatment such as wet coating is performed, or the like.

As a method of chemically performing the antiglare treatment, concretely, there can be cited a method of performing frost treatment. The frost treatment can be performed by, for example, immersing the glass substrate being a treatment object into a mixed solution of hydrogen fluoride and ammonium fluoride.

As a method of physically performing the antiglare treatment, it is possible to use, for example, what is called a sand-blast process in which a crystalline silicon dioxide powder, a silicon carbide powder, and so on are blasted to the principal surface of the glass substrate by using pressurized air, a method in which a brush having the crystalline silicon dioxide powder, the silicon carbide powder, and so on adhered thereto is moistened with water, and the principal surface of the glass substrate is polished by using the brush, and so on.

Among them, the frost treatment is preferable as the method of performing the antiglare treatment on the glass substrate because microcracks at the surface of the treatment object are difficult to occur, and the reduction in mechanical strength is difficult to occur.

It is preferable that, on the principal surface of the glass substrate after being subjected to the antiglare treatment in a chemical or physical manner as described above, an etching treatment is performed to regulate a surface shape. As the etching treatment, for example, there can be used a method in which the glass substrate is immersed in an etching solution being an aqueous solution of hydrogen fluoride to chemically perform the etching. The etching solution may also contain, acids such as a hydrochloric acid, a nitric acid, and a citric acid, in addition to hydrogen fluoride. When the etching solution contains these acids, it is possible to suppress a local generation of precipitates due to a reaction between cations such as Na ions and K ions contained in the glass substrate and hydrogen fluoride, and in addition to that, the etching can be uniformly proceeded in a treatment surface.

When the etching treatment is performed, an etching amount is adjusted by adjusting a concentration of the etching solution, an immersion time of the glass substrate into the etching solution, and the like, and thereby, a haze value of an antiglare treatment surface of the glass substrate can be adjusted to a desired value. When the antiglare treatment is performed by the physical surface treatment such as the sandblasting, cracks may occur. However, such cracks can be removed by the etching treatment. Further, it is also possible to obtain an effect such that sparkle of the substrate 10 with the low-reflection property can be suppressed by the etching treatment. Note that the sparkle means a degree of visibility disturbed by a lot of particles of light observed on a surface of a front substrate when the substrate with the low-reflection property is used as the front substrate of a display element. As the sparkle is suppressed, the particles of light are unlikely to be observed, and the visibility is improved.

The principal surface of the glass substrate after being subjected to the antiglare treatment and the etching treatment in a manner as described above preferably has surface roughness (root mean square roughness, RMS) of 0.01 to 0.5 μm. The surface roughness (RMS) is more preferably 0.01 to 0.3 μm, and still more preferably 0.01 to 0.2 μm. By setting the surface roughness (RMS) to fall within the above-described range, it is possible to adjust the haze value of the glass substrate after being subjected to the antiglare treatment to 1 to 30%, and as a result of this, it is possible to supply excellent antiglare property to the substrate 10 with the low-reflection property to be obtained. Note that the haze value is a value defined by JIS K 7136: (2000).

The surface roughness (RMS) can be measured based on a method defined by JIS B 0601: (2001). Concretely, a laser microscope (product name: VK-9700, manufactured by KEYENCE CORPORATION) is used to set a visual field range of 300 μm×200 μm with respect to a measurement surface of the glass substrate after being subjected to the antiglare treatment, being a sample, and height information of the glass substrate is measured. A cut-off correction is performed for the measurement value, and by finding a mean square of the obtained heights, it is possible to calculate the surface roughness (RMS). It is preferable to use 0.08 mm as the cut-off value.

The surface of the glass substrate after being subjected to the antiglare treatment and the etching treatment has the projecting and recessed shape, and when it is observed from above the surface of the glass substrate, it seems to be circular recessions. A size (diameter) of each circular recessed opening observed as above is preferably 1 μm or more and 10 μm or less. When the size of the recession falls within this range, it is possible to enable both the prevention of sparkle and the antiglare property. The antiglare property means a property to reduce the glare of reflected light due to reflected glare of a light source by mainly scattering the reflected light, and the glare can be more reduced as the antiglare property becomes higher.

Note that in a normal use environment, light is incident from various angles. Evaluation regarding the visibility of each of the principal surface and the side surface is also conducted under such conditions. It has been found out that the visibility of the principal surface and the visibility of the side surface in the normal use environment are correlated with the luminous reflectance measured by the SCI mode described above. This luminous reflectance does not change depending on presence/absence of the antiglare treatment of the transparent substrate 11. Accordingly, it can be considered that the visibility of each of the principal surface and the side surface is not affected by the presence/absence of the antiglare treatment of the transparent substrate 11.

(Low-Reflection Film)

In the substrate 10 with the low-reflection property of this embodiment, the first low-reflection film 12 is formed on one principal surface of the transparent substrate 11, and the second low-reflection film 13 is formed on the side surface of the transparent substrate 11. When the aforementioned antiglare treatment is performed for the transparent substrate 11, it is preferable that the first low-reflection film 12 is formed on the principal surface which is subjected to the antiglare treatment.

A configuration of each of the first low-reflection film 12 and the second low-reflection film 13 is not particularly limited as long as it is a configuration capable of suppressing the reflection of light to fall within a predetermined range, and, for example, it can be configured by stacking high-refractive-index layers and low-refractive-index layers. The high-refractive-index layer indicates a layer whose refractive index for light with a wavelength of 550 nm is 1.9 or more, and the low-refractive-index layer indicates a layer whose refractive index for the light with the wavelength of 550 nm is 1.6 or less, for example.

Regarding the number of layers of the high-refractive-index layer and the low-refractive-index layer in each of the first low-reflection film 12 and the second low-reflection film 13, it is possible to employ a mode in which one layer of each of the high-refractive-index layer and the low-refractive-index layer is included, and it is also possible to employ a configuration in which two layers or more of each of the high-refractive-index layers and the low-refractive-index layers are included. When the configuration in which one layer of each of the high-refractive-index layer and the low-refractive-index layer is included is employed, it is preferably one in which the high-refractive-index layer and the low-refractive-index layer are stacked, in this order, on the principal surface of the transparent substrate 11. Further, when the configuration in which two layers or more of each of the high-refractive-index layers and the low-refractive-index layers are included is employed, it is preferably a mode in which each high-refractive-index layer and each low-refractive-index layer are alternately stacked in this order.

In order to increase the low-reflection property, the first low-reflection film 12 and the second low-reflection film 13 are each preferably a stack formed by stacking a plurality of layers, and for example, the stack formed by stacking two layers or more and eight layers or less in total is preferable, the stack formed by two layers or more and six layers or less is more preferable, and the stack formed by stacking two layers or more and four layers or less is still more preferable. The stack described here is preferably one formed by alternately stacking the high-refractive-index layer and the low-refractive-index layer as described above, and a sum of the number of layers of the high-refractive-index layers and the low-refractive-index layers is preferably within the above-described range. It is also possible to add a layer in a range not impairing optical characteristics. For example, a SiO$_2$ film may be inserted between the glass and a first layer of the low-reflection film provided on the glass side, in order to prevent diffusion of Na from the glass substrate.

In order to control the luminous reflectance R1 of the first low-reflection film 12 to a desired range, it is preferable that a layer thickness of the high-refractive-index layer and a layer thickness of the low-refractive-index layer of the first low-reflection film 12 are appropriately adjusted. Similarly, in order to control luminous reflectance Rs of the second low-reflection film 13 to a desired range, it is preferable that a layer thickness of the high-refractive-index layer and a layer thickness of the low-refractive-index layer of the second low-reflection film 13 are appropriately adjusted.

Materials which compose the high-refractive-index layer and the low-refractive-index layer are not particularly limited, and they can be selected in consideration of a degree of required low-reflection property, productivity, and so on. As the material composing the high-refractive-index layer, there can be cited, for example, a niobium oxide (Nb$_2$O$_5$), a titanium oxide (TiO$_2$), a zirconium oxide (ZrO$_2$), a tantalum oxide (Ta$_2$O$_5$), an aluminum oxide (Al$_2$O$_3$), a silicon nitride (SiN), and the like. It is possible to favorably use one kind or more of materials selected from these materials. As the material composing the low-refractive-index layer, there can be cited a silicon oxide (particularly, silicon dioxide SiO$_2$), a material containing a mixed oxide of Si and Sn, a material containing a mixed oxide of Si and Zr, a material containing a mixed oxide of Si and Al, and the like. It is possible to favorably use one kind or more of materials selected from these materials.

From viewpoints of the productivity and the refractive index, it is preferable to employ a configuration in which the high-refractive-index layer is a layer made of one kind of material selected from the niobium oxide, the tantalum oxide, and the silicon nitride, and the low-refractive-index layer is a layer made of the silicon oxide.

(Antifouling Film)

Figure 4:
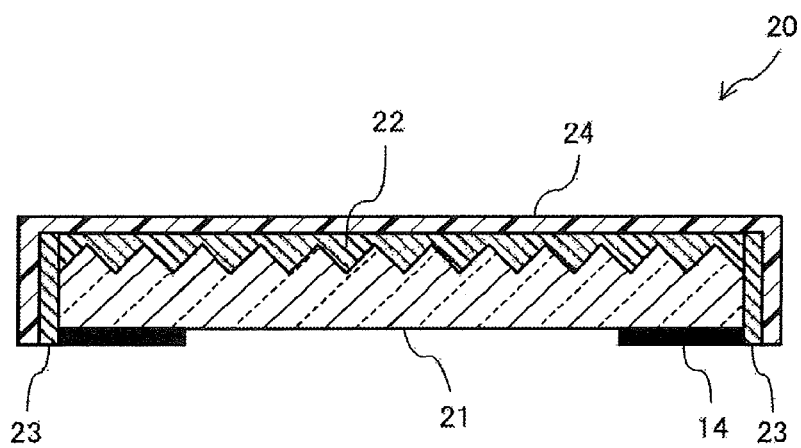
FIG. 4 is a sectional view schematically illustrating still another embodiment of a substrate with low-reflection property of the present invention.

In the substrate 10 with the low-reflection property of this invention, it is preferable to further film-form an antifouling film on an upper surface of at least one of the first low-reflection film 12 and the second low-reflection film 13. A substrate 20 with low-reflection property which has a similar configuration as the substrate 10*a* with the low-reflection property illustrated in FIG. 3 and further includes an antifouling film is exemplified in FIG. 4. The substrate 20 with the low-reflection property includes a transparent substrate 21, and further an antifouling film 24 formed on a first low-reflection film 22 provided on one principal surface of the transparent substrate 21 and a second low-reflection film 23.

A composing material of the antifouling film can be appropriately selected from materials capable of supplying an antifouling property, water repellency, and oil repellency. Concretely, there can be cited a fluorine-containing organosilicon compound. The fluorine-containing organosilicon compound can be used without being limited in particular as long as it supplies the antifouling property, the water repellency, and the oil repellency.

As the fluorine-containing organosilicon compound, for example, it is possible to favorably use an organosilicon compound having one or more of groups selected from a group consisting of a polyfluoropolyether group, a polyfluoroalkylene group, and a polyfluoroalkyl group. Note that the polyfluoropolyether group indicates a bivalent group having a structure in which a polyfluoroalkylene group and an ether oxygen atom are alternately bonded.

As a commercially available product of the fluorine-containing organosilicon compound having one or more of groups selected from the group consisting of the polyfluoropolyether group, the polyfluoroalkylene group, and the perfluoroalkyl group, it is possible to favorably use KP-801, KY-178, KY-130, and KY-185 (each being a product name, manufactured by Shin-Etsu Chemical Co., Ltd.), OPTOOL DSX and OPTOOL AES (each being a product name, manufactured by DAIKIN Industries, Ltd.), and so on.

Note that the fluorine-containing organosilicon compound is generally preserved by being mixed with a solvent of fluorine base or the like, for the purpose of suppression of deterioration due to a reaction with a moisture in the atmosphere, and the like, and if it is subjected to a film-forming process while it contains these solvents, there is a case when an adverse effect is exerted on durability and the like of an obtained thin film. For this reason, when the antifouling film is film-formed by a vacuum deposition method in accordance with a procedure described later, it is preferable to use the fluorine-containing organosilicon compound on which solvent removal processing is previously performed before heating by a heating container.

As a solvent used for preserving the above-described fluorine-containing organosilicon compound, for example, there can be cited polyfluorohexane, metaxylene hexafluoride ($C_6H_4(CF_3)_2$), hydrofluoropolyether, and HFE7200/7100 (product name, manufactured by Sumitomo 3M Ltd., in which HFE7200 is represented by Formula: $C_4F_9$—O—$C_2H_5$, and HFE7100 is represented by Formula: $C_4F_9$—O—$CH_3$) and the like. For example, a concentration of the solvent contained in the solution of the fluorine-containing organosilicon compound is preferably 1 mol % or less, and more preferably 0.2 mol % or less. It is particularly preferable to use the fluorine-containing organosilicon compound containing no solvent.

The removal processing of the solvent from the fluorine-containing organosilicon compound solution containing the fluorine-based solvent described above can be carried out by, for example, performing evacuation on a container containing the solution of the fluorine-containing organosilicon compound. A period of time of performing the evacuation is not limited since it changes due to an exhaust line, an exhaust capacity of a vacuum pump and the like, an amount of solution, and the like, but, it is necessary to perform evacuation for 10 hours or more, for example.

When the antifouling film made of the above-described fluorine-containing organosilicon compound is formed, it is preferable to use the vacuum deposition method for the film-forming. When the vacuum deposition method is used, the removal processing of the solvent described above can be performed in a manner that the fluorine-containing organosilicon compound solution is introduced into a heating container of a film-forming apparatus which performs film-forming of the antifouling film, and then, evacuation in the heating container is performed at room temperature before a temperature is raised. Further, it is possible to previously perform the solvent removal by using an evaporator or the like, before the solution is introduced into the heating container.

Note that the fluorine-containing organosilicon compound having a small content of the solvent or containing no solvent is easily deteriorated by being brought into contact with the atmosphere, when compared to the fluorine-containing organosilicon compound containing the solvent. Accordingly, regarding a keeping container of the fluorine-containing organosilicon compound having the small content of the solvent (or containing no solvent), it is preferable to use one in which the inside of the container is replaced with inert gas such as nitrogen or the like and sealed, and when handling the keeping container, it is preferable to reduce an exposure time to the atmosphere.

Concretely, when the keeping container is opened, it is preferable to immediately introduce the fluorine-containing organosilicon compound into the heating container of the film-forming apparatus which performs film-forming of the antifouling film. After the introduction, it is preferable to set the inside of the heating container to be vacuum or replace the inside of the heating container with inert gas such as nitrogen, rare gas, to thereby remove the atmosphere (air) contained in the heating container. In order that the fluorine-containing organosilicon compound can be introduced into the heating container of the film-forming apparatus from the keeping container (storage container) without being brought into contact with the atmosphere, the keeping container and the heating container are more preferably connected by a pipe with a valve, for example.

After the fluorine-containing organosilicon compound is introduced into the heating container and then the inside of the container is evacuated or replaced with the inert gas, it is preferable to immediately start heating for the film-forming.

In this invention, a film thickness of the antifouling film 24 formed on the second low-reflection film 22 is not particularly limited, but it is preferably 2 to 20 nm, more preferably 2 to 15 nm, and still more preferably 2 to 10 nm. When the film thickness is 2 nm or more, a state where surfaces of the low-reflection films 22, 23 are uniformly covered by the antifouling film 24 is created, resulting in that it is possible to withstand practical use from a viewpoint of scratch resistance. Besides, when the film thickness is 20 nm or less, optical characteristics such as the haze value are fine in a state where the antifouling film is stacked thereon.

As a film-forming method of the antifouling film, it is possible to use either a dry method such as the vacuum deposition method, an ion beam assisted vapor deposition method, an ion plating method, a sputtering method, or a plasma CVD method, or a wet method such as a spin coating method, a dip coating method, a casting method, a slit coating method, or a spray method. From a viewpoint of scratch resistance, it is preferable to use the dry film-forming method.

(Black Printed Shade)

The substrate 10 with the low-reflection property of this invention may be provided with the black printed shade 14 on a part of a different principal surface of the transparent substrate 11 from the principal surface where the first low-reflection film 12 is formed. The black printed shade 14 may be a light shielding part which shields a part that comes in sight to be an obstruction when seeing a display, such as wiring circuits disposed in an outer peripheral part of a display panel, to thereby enhance visibility of display and a beautiful appearance, or it may also be a printed shade of characters, patterns, or the like. The black printed shade may be formed before the first low-reflection film 12 and the second low-reflection film 13 are film-formed, or may be formed after these low-reflection films are film-formed.

In this invention, "a region having the black printed shade" is a region where the substrate with the low-reflection property has the black printed shade in a vertical cross section (a cross section along a thickness direction). In the following description, "the region having the black printed shade" is also referred to as "a region provided with the black printed shade". A region where the substrate with the low-reflection property does not have the black printed shade in the vertical cross section is also referred to as "a region having no black printed shade".

This black printed shade 14 is formed by a method printing black ink. As a printing method, there are a bar coating method, a reverse coating method, a gravure coating method, a die coating method, a roll coating method, a screen method, an ink-jet method, and so on. Among them, the screen printing method is preferable because printing can be performed easily, printing on various substrate materials is possible, and further, printing according to a size of the substrate material is possible.

The black ink can be used without being limited in particular. As the black ink, there can be used inorganic ink containing a ceramic fired body or the like, or organic ink containing a color material such as dye or pigment and an organic resin.

As the ceramics contained in the black inorganic ink, there are an oxide such as a chromium oxide or an iron oxide, a carbide such as a chromium carbide or a tungsten carbide, carbon black, mica, and so on. The black printed shade 14 is obtained in a manner that ink made of the ceramics and silica is melted, printed in a desired pattern, and then subjected to firing. This inorganic ink requires melting and firing processes, and in general, it is used as glass dedicated ink.

The organic ink is a composition containing the black dye or pigment and the organic resin. As the organic resin, there can be cited an epoxy-based resin, an acryl-based resin, polyethylene terephthalate, polyethersulfone, polyarylate, polycarbonate, a transparent ABS resin, a phenol resin, an acrylonitrile-butadiene-styrene resin, a homopolymer such as polyurethane, polymethyl methacrylate, polyvinyl, polyvinylbutyral, polyetheretherketone, polyethylene, polyester, polypropylene, polyamide, or polyimide, and a resin made of a copolymer of a monomer of these resins and a monomer capable of being copolymerized with the monomer. The dye or pigment can be used without being limited in particular, as long as it is a black one.

Between the inorganic ink and the organic ink, usage of the organic ink is preferable because a firing temperature thereof is low. In addition, the organic ink containing pigment is preferable from a viewpoint of chemical resistance.

The printing of black color indicates that the luminous reflectance R2 calculated by the aforementioned method regarding the black printed shade is 1% or less, preferably 0.8% or less, and more preferably 0.6% or less, and a value of chromaticity (a*, b*) defined by JIS Z8781-4: 2013 measured under a light source of D65 is (0±2, 0±2). The value of the chromaticity (a*, b*) is preferably (0±1.5, 0±1.5), and more preferably (0±1, 0±1).

Since the substrate 10 with the low-reflection property of this embodiment has the low-reflection film whose luminous reflectance is adjusted on each of the principal surface and the side surface, a large change in visibility is unlikely to be recognized from the black printed shade provided for the purpose of light shielding and the like at the outer peripheral part toward the side surface. For this reason, when the substrate 10 with the low-reflection property of this embodiment is used as a front substrate such as a cover glass of a display device, it is possible to improve visibility of display, and to supply good design and a beautiful appearance.

[Manufacturing Method of Substrate with Low-Reflection Property]

(Formation of Low-Reflection Film)

First, the transparent substrate 11 described above is prepared, then the low-reflection film is formed on one principal surface and the side surface of this transparent substrate 11.

A method of performing film-forming of each layer composing the first low-reflection film 12 and the second low-reflection film 13 is not particularly limited, and various film-forming methods can be used. For example, there can be used physical vapor deposition methods such as the vacuum deposition method, the ion beam assisted vapor deposition method, the ion plating method, the sputtering method, and the plasma CVD method. Among these film-forming methods, the sputtering method is preferably used because it is possible to form a dense film with high durability. In particular, it is preferable to perform film-forming by the sputtering method such as a pulse sputtering method, an AC sputtering method, or a digital sputtering method.

When the film-forming is performed, the first low-reflection film 12 and the second low-reflection film 13 may be formed by separate processes, or may be formed simultaneously. When they are simultaneously formed, stacking directions are different depending on the principal surface and the side surface. Accordingly, it is necessary to pay particular attention to conditions for the film-forming so that the desired low-reflection film can be each formed.

For example, when the film-forming of the low-reflection film is performed by the pulse sputtering method, the transparent substrate 11 such as the glass substrate is disposed in a chamber in a mixed gas atmosphere of inert gas and oxygen gas, and a target is selected to be film-formed so as to be a desired composition. At this time, a kind of gas of the inert gas in the chamber is not particularly limited, and there can be used various inert gases such as argon and helium.

A pressure in the chamber by the mixed gas of the inert gas and the oxygen gas is not particularly limited, but when it is set to fall within a range of 0.5 Pa or less, it becomes easy to set surface roughness of the film to be formed to fall within a preferable range. It can be considered that this is because of the reasons to be described below. Namely, when the pressure in the chamber by the mixed gas of the inert gas and the oxygen gas is 0.5 Pa or less, a mean free path of film-forming molecules is secured, and the film-forming molecules reach the substrate with more energy. Accordingly, it can be considered that reallocation of the film-forming molecules is accelerated, resulting in that a film having a relatively dense and smooth surface is formed. A lower limit value of the pressure in the chamber by the mixed gas of the inert gas and the oxygen gas is not particularly limited, but, for example, it is preferably 0.1 Pa or more.

When the high-refractive-index layer and the low-refractive-index layer are film-formed by the pulse sputtering method, it is possible to adjust a layer thickness of each layer by, for example, adjustment of discharge power, adjustment of a film-forming time, and so on.

Figure 5:
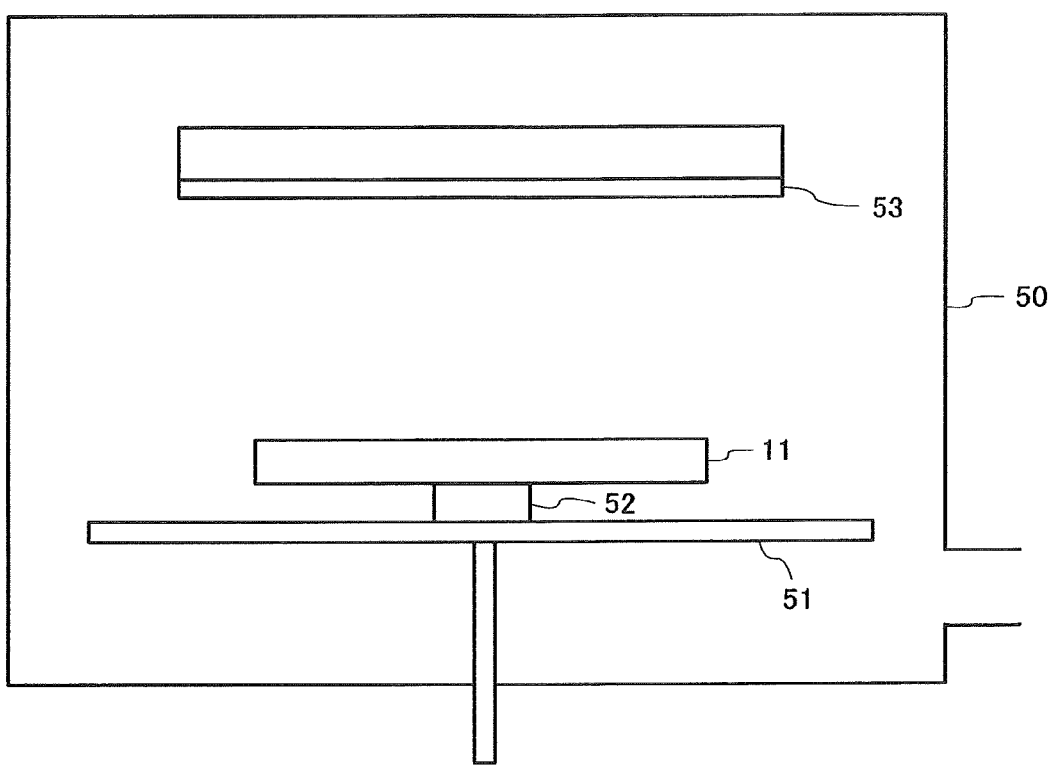
FIG. 5 is a view illustrating an example of a sputtering operation used for a manufacturing method of a substrate with low-reflection property of the present invention.

When the first low-reflection film 12 and the second low-reflection film 13 are simultaneously film-formed by the sputtering, as illustrated in FIG. 5, a spacer 52 is provided between the transparent substrate 11 and a carrier substrate 51 holding the transparent substrate 11 in a chamber 50, they are retained while having a predetermined interval between the transparent substrate 11 and the carrier substrate 51, and the sputtering is performed by using a sputtering target 53 under this state to perform film-forming.

At this time, a film thickness independent of a size of the spacer 52 is deposited on the principal surface, but regarding the side surface, there are a component which is directly film-deposited on the side surface of the transparent substrate 11 from the target 53 and a component which is film-deposited on the side surface of the transparent substrate 11 from the target 53 by being reflected by the carrier substrate 51. A component ratio can be changed by a distance between the target and the transparent substrate and a distance between the carrier substrate and the transparent substrate. It is thereby possible to change a relationship between a film thickness of the principal surface and a film thickness of the side surface, and to change the color of the side surface while fixing the color of the principal surface. This method can be effectively used in a mode where film-particles fly in relatively high vacuum. The physical film-forming can be performed by using the vacuum deposition method, the ion beam assisted vapor deposition method, the ion plating method, and the sputtering method.

The plasma CVD method is in relatively low vacuum, and the mean free path of film-particles is short, and therefore, it is difficult to control the color difference between the side surface and the principal surface by using this method. The mean free path of the film-particles is determined by a pressure in the chamber during the film-forming, and the pressure is preferably 1 Pa or less, and more preferably 0.5 Pa or less. At this time, the sputtering can be performed according to operations similar to the normal sputtering except that the aforementioned interval is provided.

The transparent substrate 11 and the carrier substrate 51 are held to have a predetermined interval therebetween, and thereby, the film-forming is simultaneously enabled on the side surface of the transparent substrate 11 owing to the reflection or the like from the carrier substrate 51 in addition to the principal surface of the transparent substrate 11 on the sputtering target side. At this time, when a distance between the sputtering target 53 and the transparent substrate 11 is set to 50 to 90 mm, the interval between the transparent substrate 11 and the carrier substrate 51 formed by the spacer 52 is, for example, preferably 1 to 6 mm though it also depends on other film-forming conditions.

The substrate with the low-reflection property obtained as stated above is suitably used as a front substrate of a display. That is, a display device including the display and the substrate with the low-reflection property of this embodiment provided as the front substrate at a front face of the display can be seen naturally because a difference between visibility of the display and visibility of a side surface of the front substrate is small. Accordingly, it is possible to improve display visibility of the display device, and to supply good design and a beautiful appearance by using the substrate with the low-reflection property.

EXAMPLE

Hereinafter, the present invention will be described in detail by using examples. Note that the present invention is not limited to them.

In the following description, a processing procedure of a glass substrate will be described first. In each of examples and comparative examples, Dragontrail (product name, manufactured by Asahi Glass Co., Ltd., thickness of 1.3 mm, also referred to as "DT", hereinafter) being a glass substrate for chemical tempering was used as a glass substrate.

Example 1

(1) First, an acid-resistant protective film (hereinafter, it is also referred to just as a "protective film") was bonded to one principal surface of the DT, and then the DT was immersed in a 3 weight % hydrogen fluoride solution for three minutes to be etched, thereby removing fouling adhered to a surface of the substrate.

Next, the glass substrate after the fouling thereof was removed was immersed in a mixed solution of 15 weight % hydrogen fluoride and 15 weight % potassium fluoride for three minutes to be subjected to the frost treatment (antiglare treatment), and then immersed in a 10 weight % hydrogen fluoride solution for six minutes, to thereby adjust the haze value to 25%. The haze value was measured by using a haze meter (product name: HZ-V3, manufactured by Suga Test Instruments Co., Ltd.), based on JIS K 7136.

(2) Next, the substrate was cut into a size of 150 mm×250 mm. Chamfering of C0.2 was performed with a grindstone #600 (manufactured by Tokyo Diamond Tools Mfg. Co., Ltd.). At this time, the number of rotations of the grindstone was 6500 rpm, a moving speed of the grindstone was 5000 mm/min, and a polishing margin was set to 0.2 mm.

(3) Next, chemical tempering was performed according to the following procedures.

The substrate from which the protective film was removed was immersed in potassium nitrate salt which was heated to 450° C. to be melted for two hours, and after that, the substrate was pulled up from the molten salt, and subjected to slow cooling to room temperature in one hour to perform the chemical tempering. Consequently, there was obtained a chemically-tempered glass substrate whose surface compressive stress (CS) was 730 MPa, and whose depth of a stress layer (DOL) was 30 µm.

(4) Subsequently, this substrate was immersed in an alkaline solution (manufactured by Lion Corporation, product name: Sunwash TL-75) for four hours.

(5) Next, the screen printing was performed on a surface of the substrate where antiglare treatment was not performed according to the following procedures. Printing was performed to make a black frame shape with a width of 2 cm at all sides of an outer peripheral part of the principal surface of the glass substrate where no antiglare treatment was performed, to thereby form the black printed shade. First, after black ink (GLSHF (product name, manufactured by Teikoku Printing Inks Mfg. Co., Ltd.)) was coated with a thickness of 5 µm by a screen printer, it was retained at 150° C. for 10 minutes to be dried, to thereby form a first printed layer. Next, after the black ink was coated with a thickness of 5 µm on the first printed layer according to the same procedure as above, it was retained at 150° C. for 40 minutes to be dried, to thereby form a second printed layer. In a manner as described above, the black printed shade in which the first printed layer and the second printed layer were stacked was formed, and the glass substrate provided with the black printed shade at the outer peripheral part of one principal surface was obtained.

(6) Next, the low-reflection film was formed on each of the principal surface and the side surface where the antiglare treatment was performed according to the following method.

First, a 50 mm square PEEK resin with a thickness of 2 mm was bonded to the glass substrate at a center part sufficiently far from the side surface with a double-sided adhesive tape. The PEEK resin part was bonded to a center of a 1000 mm square large glass with a thickness of 2 mm (it was called a carrier substrate). A material of the carrier substrate at this time was not particularly limited, and a substrate made of a resin or metal may be used. It was thereby possible to control an incident angle of film-forming particles which was incident on the side surface of the substrate by being reflected by the carrier substrate at a rear surface, and the film-forming on the side surface could be simultaneously performed.

First, a distance between the target and the substrate was set to 70 mm under a state where the substrate was bonded to the carrier substrate.

Next, the pulse sputtering was performed under conditions of a pressure of 0.3 Pa, a frequency of 20 kHz, a power density of 3.8 W/cm$^2$, and a reverse pulse width of 5 μsec by using a niobium oxide target (manufactured by AGC Ceramics Co., Ltd., product name: NBO target) while introducing mixed gas in which oxygen gas was mixed to be 10 volume % to argon gas, to thereby form a high-refractive-index layer made of a niobium oxide (niobia) with a thickness of 13 nm on a principal front surface. The film thickness can be calculated by fitting from an optical thin film interference formula using refractive indexes of materials composing the film regarding spectrum of R1 calculated as described above. The calculation of the film thickness is not limited thereto, and the film thickness may be found from a value of a quartz resonator capable of indirectly grasping the film thickness at the sputtering time.

Next, the pulse sputtering was performed under conditions of a pressure of 0.3 Pa, a frequency of 20 kHz, a power density of 3.8 W/cm$^2$, and a reverse pulse width of 5 μsec by using a silicon target while introducing mixed gas in which oxygen gas was mixed to be 40 volume % to argon gas, to thereby form a low-refractive-index layer made of a silicon oxide (silica) with a thickness of 35 nm on the high-refractive-index layer.

Then, the high-refractive-index layer made of the niobium oxide (niobia) with the thickness of 115 nm was formed on the low-refractive-index layer similarly to the first layer.

Next, the low-refractive-index layer made of the silicon oxide (silica) with the thickness of 80 nm was formed similarly to the second layer.

In a manner as described above, a low-reflection film in which the niobium oxide (niobia) and the silicon oxide (silica) were alternately stacked in total four layers was formed.

Regarding the film thickness, the low-reflection film was formed such that the film thickness of the first low-reflection film and the film thickness of the second low-reflection film are the equivalent film thickness.

(7) Next, an antifouling film was film-formed according to the following method. The substrate was input while being bonded to the carrier substrate, and the antifouling film was efficiently film-formed also on the side surface simultaneously with the film-forming on the principal surface where the low-reflection film was formed. First, formation materials of a fluorine-containing organosilicon compound film were introduced into a heating container as materials of the antifouling film. After that, deaeration in the heating container was performed for 10 hours or more by a vacuum pump to remove solvent in the solution to make a formation composition of the fluorine-containing organosilicon compound film (hereinafter, referred to as an antifouling film forming composition).

Next, the heating container accommodating the antifouling film forming composition (manufactured by Shin-etsu Chemical Co., Ltd., product name: KY-185) was heated to 270° C., and after the temperature reached 270° C., the state was kept for 10 minutes until the temperature was stabilized. Next, after the glass substrate on which the low-reflection film was formed was placed in a vacuum chamber, the antifouling film forming composition was supplied from a nozzle connected to the heating container accommodating the antifouling film forming composition toward the low-reflection film of the glass substrate, to thereby perform the film-forming.

The film-forming was performed while measuring a film thickness by a quartz resonator monitor placed in the vacuum chamber, and continued until a film thickness of the fluorine-containing organosilicon compound film on the low-reflection film became 4 nm. Next, the glass substrate taken out of the vacuum chamber was placed on a hot plate in a manner that the fluorine-containing organosilicon compound film surface faced upward, and heat treatment was performed in the atmosphere at 150° C. for 60 minutes.

(8) In a manner as described above, a glass substrate 1 with low-reflection property where a predetermined film configuration was formed on the glass substrate was manufactured.

Example 2

A glass substrate 2 with low-reflection property was manufactured by the same operation as Example 1 except that (7) the film-forming process of the antifouling film was not performed in the description of Example 1.

Example 3

A glass substrate 3 with low-reflection property was manufactured by the same operation as Example 1 except that (1) the antiglare treatment was not performed, (6) the distance between the target and the substrate was set to 60 mm in the film-forming process of the low-reflection film, and (7) the resin composition used in the film-forming process of the antifouling film was changed to an antifouling film forming composition (manufactured by DAIKIN Industries, Ltd., OPTOOL DCY), and the thickness of the PEEK resin between the glass substrate and the carrier substrate was set to 3 mm in the description of Example 1.

Example 4

A glass substrate 4 with low-reflection property was manufactured by the same operation as Example 1 except that (6) the distance between the target and the substrate was set to 80 mm in the film-forming process of the low-reflection film, and the thickness of the PEEK resin between the glass substrate and the carrier substrate was set to 4 mm in the description of Example 1.

Example 5

A glass substrate 5 with low-reflection property was manufactured by the same operation as Example 1 except that (6) the low-reflection film was changed to the following stacked film in the film-forming process of the low-reflection film in the description of Example 1.

As the low-reflection film, first, the pulse sputtering was performed under conditions of a pressure of 0.3 Pa, a frequency of 20 kHz, a power density of 3.8 W/cm$^2$, and a reverse pulse width of 5 sec by using a silicon target while introducing mixed gas in which nitrogen gas was mixed to be 50 volume % to argon gas, to thereby form a high-refractive-index layer made of a silicon nitride with a thickness of 15 nm.

Next, the pulse sputtering was performed under conditions of a pressure of 0.3 Pa, a frequency of 20 kHz, a power density of 3.8 W/cm$^2$, and a reverse pulse width of 5 μsec by using a silicon target while introducing mixed gas in which oxygen gas was mixed to be 40 volume % to argon gas, to thereby form a low-refractive-index layer made of a silicon oxide (silica) with a thickness of 70 nm on the high-refractive-index layer.

Next, the high-refractive-index layer made of the silicon nitride with the thickness of 17 nm was formed on the low-refractive-index layer as a third layer similarly to the first layer, and the low-refractive-index layer made of the silicon oxide (silica) with the thickness of 105 nm was formed as a fourth layer similarly to the second layer.

Next, the high-refractive-index layer made of the silicon nitride with the thickness of 15 nm was formed on the low-refractive-index layer as a fifth layer similarly to the first layer, and the low-refractive-index layer made of the silicon oxide (silica) with the thickness of 50 nm was formed as a sixth layer similarly to the second layer.

Next, the high-refractive-index layer made of the silicon nitride with the thickness of 120 nm was formed on the low-refractive-index layer as a seventh layer similarly to the first layer, and the low-refractive-index layer made of the silicon oxide (silica) with the thickness of 80 nm was formed as an eighth layer similarly to the second layer.

In a manner as described above, a low-reflection film in which the silicon nitride and the silicon oxide (silica) were alternately stacked in total eight layers was formed.

Comparative Example 1

A substrate C1 with low-reflection property was obtained by the same operation as Example 1 except that (6) the glass substrate was directly bonded to be fixed to the carrier substrate (namely, the distance between the glass substrate and the carrier substrate was set to "0" (zero) mm without using the PEEK resin) in the film-forming process of the low-reflection film in the description of Example 1.

Comparative Example 2

A substrate C2 was obtained by the same operation as Example 1 except that (6) the film-forming process of the low-reflection film was not performed in the description of Example 1.

Comparative Example 3

A glass substrate C3 with low-reflection property was manufactured by the same operation as Example 1 except that (6) the distance between the target and the substrate was set to 180 mm, and the thickness of the PEEK resin between the glass substrate and the carrier substrate was set to 30 mm in the film-forming process of the low-reflection film in the description of Example 1.

<Characteristics of Substrate with Low-Reflection Film>

The following evaluation was performed for the glass substrate with the low-reflection property obtained in each of Examples 1 to 5, and Comparative examples 1 to 3. These results are illustrated in Table 1 together with a configuration of each substrate with the low-reflection property.

(Luminous Reflectance of Principal Surface)

Regarding the principal surface of the substrate having the black printed shade at the rear surface, spectral reflectance was measured in the SCI mode by a spectrophotometric colorimeter (manufactured by KONICA MINOLTA, INC., product name: CM-2600d), and from the measured spectral reflectance, the luminous reflectance Rtot (the stimulus value Y of reflection defined by JIS Z8701: 1999) was found.

(Luminous Reflectance and Color of Side Surface)

Regarding the side surface of the substrate, spectral reflectance was obtained by using a micro spectrophotometer (manufactured by Olympus Corporation, USPM RUIII). When measurement was performed, a position of the substrate where reflectance became maximum were found in advance, and adjustment was performed to obtain regular reflectance. The luminous reflectance Rs (the stimulus value Y of reflection defined by JIS Z8701: 1999) and the color (L*a*b*) were found from the spectral reflectance.

(Contact Angle)

A contact angle with respect to water was measured by using a contact angle meter (manufactured by Kyowa Interface Science Co., Ltd., device name: DM-51) by dripping approximately 1 μL of pure water droplets on a surface of the glass substrate on a side provided with the low-reflection property (a surface where the antiglare treatment was performed in Comparative example 2).

(Evaluation of Color Difference Between Principal Surface and Side Surface)

A frame which is 0.5 mm larger than the glass substrate was prepared, and the glass substrate was put into the frame to be a center and fixed. A depth of the frame was set to 0.8 mm to have a structure in which the glass protruded for about 0.5 mm. A color of the frame was set to black. The substrate in this state was visually recognized from various angles under fluorescent light to visually examine whether the color continues smoothly from the principal surface toward the side surface. Five examiners checked to determine good and bad.

TABLE 1-1

|  |  |  | Example 1 | Example 2 | Example 3 | Example 4 |
|---|---|---|---|---|---|---|
| CONFIGURATION | Substrate | Kind | DT | DT | DT | DT |
|  |  | Thickness | 1.3 mm | 1.3 mm | 1.3 mm | 1.3 mm |
|  |  | Antiglare treatment | Applied | Applied | N/A | Applied |
|  |  | Chemical tempering | Applied | Applied | Applied | Applied |
|  |  | Black film printing | Applied | Applied | Applied | Applied |
|  | Low-reflection film | Film-forming part | Principal surface & side surface | Principal surface & side surface | Principal surface & side surface | Principal surface & side surface |

TABLE 1-1-continued

|  |  | Example 5 | Comparative Example 1 | Comparative Example 2 | Comparative Example 3 |
|---|---|---|---|---|---|
|  | Layer configuration | NBO 13 nm<br>SiO₂ 35 nm<br>NBO 115 nm<br>SiO₂ 80 nm | NBO 13 nm<br>SiO₂ 35 nm<br>NBO 115 nm<br>SiO₂ 80 nm | NBO 13 nm<br>SiO₂ 35 nm<br>NBO 115 nm<br>SiO₂ 85 nm | NBO 13 nm<br>SiO₂ 35 nm<br>NBO 115 nm<br>SiO₂ 85 nm |
| Anti-fouling film | Material | KY-185 | Absence | OPTOOL DSX | KY-185 |
|  | Film thickness | 4 nm | — | 4 nm | 4 nm |
| Configuration at manufactured time | Distance between target and substrate | 70 mm | 70 mm | 60 mm | 80 mm |
|  | Distance between substrate and carrier substrate | 2 mm | 2 mm | 3 mm | 4 mm |

|  |  |  | Example 5 | Comparative Example 1 | Comparative Example 2 | Comparative Example 3 |
|---|---|---|---|---|---|---|
| CONFIGURATION | Substrate | Kind | DT | DT | DT | DT |
|  |  | Thickness | 1.3 mm | 1.3 mm | 1.3 mm | 1.3 mm |
|  |  | Antiglare treatment | Applied | Applied | Applied | Applied |
|  |  | Chemical tempering | Applied | Applied | Applied | Applied |
|  |  | Black film printing | Applied | Applied | Applied | Applied |
|  | Low-reflection film | Film-forming part | Principal surface & side surface | Only principal surface | Absence | Principal surface & side surface |
|  |  | Layer configuration | SiN 15 nm<br>SiO₂ 70 nm<br>SiN 17 nm<br>SiO₂ 105 nm<br>SiN 15 nm<br>SiO₂ 50 nm<br>SiN 120 nm<br>SiO₂ 80 nm | NBO 13 nm<br>SiO₂ 35 nm<br>NBO 115 nm<br>SiO₂ 80 nm |  | NBO 13 nm<br>SiO₂ 35 nm<br>NBO 115 nm<br>SiO₂ 85 nm |
|  | Anti-fouling film | Material | KY-185 | KY-185 | Absence | Absence |
|  |  | Film thickness | 4 nm | 4 nm | — | — |
|  | Configuration at manufactured time | Distance between target and substrate | 70 mm | 70 mm | 70 mm | 180 mm |
|  |  | Distance between substrate and carrier substrate | 2 mm | 0 mm | 0 mm | 30 mm |

TABLE 1-2

|  |  | Example 1 | Example 2 | Example 3 | Example 4 | Example 5 | Comparative Example 1 | Comparative Example 2 | Comparative Example 3 |
|---|---|---|---|---|---|---|---|---|---|
| Characteristics | Luminous reflectance of principal surface (black printed shade) | 1.0% | 1.0% | 0.8% | 0.8% | 1.5% | 1.0% | 4.2% | 0.8% |
|  | Color of principal surface (black printed shade) | (0.5, 1.3) | (0.5, 2.2) | (0.5, 1.5) | (0.5, 1.5) | (1.5, 1.2) | (0.5, 1.3) | (0, −0.5) | (0.5, 1.5) |
|  | Luminous reflectance of side surface | 1.7% | 1.7% | 1.6% | 1.6% | 2.0% | 0.5% | 0.5% | 1.6% |
|  | Color of side surface | (2.5, 8.0) | (2.0, 7.5) | (1.0, 7.5) | (0.5, 6.5) | (1.2, 4.5) | (1.1, 0.2) | (1.0, 0.1) | (−4.0, 4.0) |
|  | Water contact angle | 112° | 20° | 116° | 113° | 110° | 113° | 15° | 30° |
|  | Visibility of difference between side surface and principal surface | Good | Good | Good | Good | Good | Bad | Good | Bad |

From Table 1, in the glass substrate with the low-reflection property in each of Example 1 to Example 5, the luminous reflectance of the principal surface, the luminous reflectance of the side surface, and the chromaticity each satisfy a predetermined range, changes in light reflection and color, and so on when the principal surface and the side surface were visually recognized could be suppressed to be large, and visibility was good. On the other hand, in the glass substrate with the low-reflection property in each of Comparative examples 1, 3 in which the luminous reflectance and the chromaticity were out of the predetermined range, the changes in the light reflection and color between the principal surface and the side surface were largely outstanding, and the visibility was bad. In Comparative example 2, the luminous reflectance Rtot of the first low-reflection film was large, and it was recognized that the visibility of the display part was lowered.

In the substrate with the low-reflection property of the present invention, changes in light reflection and color are suppressed between the principal surface and the side surface, and the changes are unlikely to be visually recognized. Accordingly, the substrate with the low-reflection property of the present invention is suitable as a front substrate of a display device, and good display visibility, excellent design, and a beautiful appearance can be supplied.

What is claimed is:

1. A substrate with low-reflection property, comprising:
    a transparent substrate;
    a first low-reflection film provided on one principal surface of the transparent substrate;
    a second low-reflection film provided on all side surfaces of the transparent substrate; and
    a black printed shade on a part of the principal surface of the transparent substrate which is opposite from the first low-reflection film,
    wherein luminous reflectance Rtot of the first low-reflection film provided on the one principal surface is 1.5% or less, luminous reflectance Rs of the second low-reflection film provided on the side surface is 2.5% or less, chromaticity a* of the second low-reflection film provided on the side surface is 0 to 4, and chromaticity b* of the second low-reflection film provided on the side surface is 3 to 9;
    wherein the first low-reflection film is a multilayer film of between 2 to 8 layers of alternately stacked high-refractive index and low-refractive index layers; and
    wherein the second low-reflection film is a multilayer film of between 2 to 8 layers of alternately stacked high-refractive index and low-refractive index layers.

2. The substrate with the low-reflection property according to claim 1,
    wherein the first low-reflection film provided on an opposite side of the transparent substrate from the black printed shade has the chromaticity a* of more than −6 and less than 6, and the chromaticity b* of more than −6 and less than 6.

3. The substrate with the low-reflection property according to claim 1,
    wherein the luminous reflectance Rtot of the first low-reflection film is 1.2% or less.

4. The substrate with the low-reflection property according to claim 1,
    wherein the luminous reflectance Rs of the second low-reflection film provided on the side surface is 2% or less.

5. The substrate with the low-reflection property according to claim 1,
    wherein a ratio of the luminous reflectance Rs to the luminous reflectance Rtot is 1 to 3.

6. The substrate with the low-reflection property according to claim 1,
    wherein the transparent substrate has an asperity shape due to an antiglare treatment on each of the one principal surface and the side surfaces.

7. The substrate with the low-reflection property according to claim 1,
    wherein the transparent substrate is a glass substrate.

8. The substrate with the low-reflection property according to claim 7,
    wherein the glass substrate is a chemically tempered glass.

9. The substrate with the low-reflection property according to claim 8,
    wherein a surface compressive stress of the chemically tempered glass is 400 MPa or more and 1200 MPa or less.

10. The substrate with the low-reflection property according to claim 9,
    wherein a depth of a surface compressive stress layer of the chemically tempered glass is 15 μm to 60 μm.

11. A display device, comprising:
    a display; and
    the substrate with the low-reflection property according to claim 1 provided on a front face of the display as a front substrate.

* * * * *